CURRENT-VOLTAGE CHARACTERISTICS

N-TYPE GERMANIUM RESISTIVITY NORMALIZED TO 25°C, VERSUS TEMPERATURE

INVENTORS
DAVID H. NAVON
AMARJIT CHOPRA
BY
Ezekiel Wolf, Wolf & Greenfield
ATTORNEYS

SEMICONDUCTOR DEVICE

Filed March 30, 1962 2 Sheets-Sheet 2

X=NORMAL (WITHOUT SEMICONDUCTOR SHUNT)

O=$R_{SHUNT}$=400Ω AT 30°C; SHUNT MATERIAL 2.7 ohm cm N-TYPE Ge

Δ=$R_{SHUNT}$=400 ohms AT 30°C; SHUNT MATERIAL 20 ohms cm N-TYPE Ge

INVENTORS
DAVID H. NAVON
AMARJIT CHOPRA
BY
Ezekiel Wolf, Wolf & Greenfield
ATTORNEYS 3,268,780
Patented August 23, 1966

United States Patent Office

3,268,780
SEMICONDUCTOR DEVICE

David H. Navon, West Peabody, and Amarjit Chopra, Cambridge, Mass., assignors to Transitron Electronic Corporation, Wakefield, Mass., a corporation of Delaware Filed Mar. 30, 1962, Ser. No. 183,818
6 Claims. (Cl. 317—235)

The present invention relates in general to semiconductor devices and more particularly concerns a novel controllable switching device affording control over a relatively large load current with a relatively small control current, the degree of control being relatively insensitive to changes in temperature.

A typical prior art device for switching a heavy load current comprises four contiguous semiconductor layers establishing three rectifying junctions, adjacent junctions being oppositely sensed. One end layer normally functions as the emitter layer and the other end layer as the collector layer. The intermediate layer next to the emitter layer functions as a base layer. Such devices have a bistable characteristic, the two stable states corresponding to a low and high impedance between two layers. If a third terminal is connected to the base or gate layer, control of the base or gate current may be used to switch stable states.

A typical four-layer PNPN semiconductor switching device may be characterized by one or more critical parameters. One parameter is the forward breakover voltage (designated $V_{BO}$), and the other may be the base or gate current (designated $I_{GF}$), each parameter corresponding to a critical value required to switch the device from a high impedance state to a low impedance state.

One problem encountered with devices of this type is the sensitivity of these critical parameters to temperature. This problem is especially serious when the device forms a component in a system subject to changes in ambient temperature. Undesired switching may occur in the presence of temperature changes to cause erratic operation of the associated system.

One prior art approach to solving this problem utilized an external conventional resistor connected between the base terminal and emitter terminal to reduce the effective switching gain at all temperatures. This approach reduced erratic switching at high temperatures at the expense of reducing gain at lower temperatures so that increased control switching power was required.

The present invention has as an important object the provision of an improved semiconductor switching device characterized by high switching gain over a wide temperature range with great stability.

It is still another object of the invention to provide a semiconductor device in accordance with the preceding objects in a compact device structure requiring no external resistors and occupying substantially the same volume as a prior art device of considerably less temperature stability.

According to the invention the semiconductor switching device described can include a plurality of contiguous layers of semiconductor material defining at least two rectifying junctions of opposite polarity, and semiconductor material introducing a shunt resistance across one of the rectifying junctions, the shunt resistance decreasing with increase in temperature of that one junction.

Numerous other features, objects and advantages of the invention will become apparent from the following specification when read in connection with the accompanying drawing in which.

Figure 1:
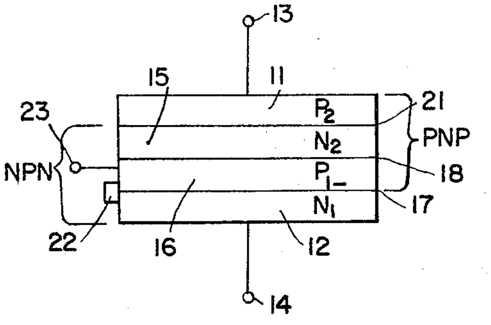
FIG. 1 shows a diagrammatic representation of an improved multiple layer semiconductor switching device according to the invention.

With reference now to the drawing and more particularly FIG. 1 thereof, there is shown an exemplary embodiment of the invention having a P end layer 11 functioning as a collector layer and an N layer 12 functioning as an emitter layer. Layers 11 and 12 are connected to collector terminal 13 and emitter terminal 14, respectively. The device also comprises an N intermediate layer 15 and a P intermediate layer 16, the latter functioning as a base layer. Emitter layer 12 and base layer 16 are separated by a base-emitter rectifying junction 17. A base terminal 23 may be connected to base layer 16.

Intermediate layers 15 and 16 are separated by an intermediate rectifying junction 18. Collector layer 11 and intermediate layer 15 define an end rectifying junction 21 of the same polarity as junction 17 and opposite to the polarity of junction 18. That is, a potential applied between terminals 13 and 14 that reverse biases junctions 21 and 17, forward biases junction 18. The improvement according to the invention comprises connecting a layer of nonintrinsic semiconductor material 22 across one or more intermediate junctions to introduce a shunt resistance which decreases with increasing temperature.

Operation of the device may be better understood by considering the lower three layers 12, 16 and 15 as an NPN transistor and the upper three layers 11, 15 and 16 as a PNP transistor, each transistor having a current gain contributing to the total switching gain of the device. If these gains change with temperature, the total gain of the device will change and switching will occur at a critical emitter-collector voltage which changes with temperature.

Figure 2:
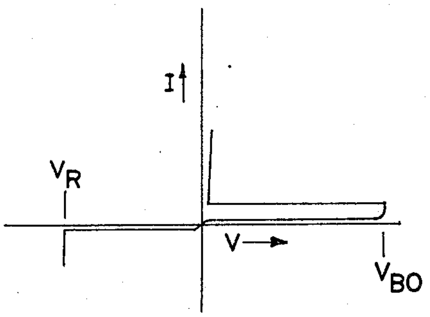
FIG. 2 shows a typical current-voltage characteristic of a PNPN device.

Referring to FIG. 2, there is shown a typical current-voltage characteristic of a PNPN switching device in which the current flowing through terminal 13 is plotted as a function of the voltage between terminals 13 and 14. With the device initially in the high resistance of essentially nonconductive state, the potential between terminals 13 and 14 is less than that of the breakover potential $V_{BO}$. If the potential between terminals 13 and 14 is then increased above $V_{BO}$, the device assumes its low resistance or heavily conducting state with the potential across terminals 13 and 14 becoming very low. The current flowing through terminal 13 is then limited by the external load connected between terminals 13 and 14. Alternately, this switching may be effected by introducing a base or gate current into terminal 23 at least equal to the critical firing current $I_{GF}$. It is known that both the breakover voltage and the gate firing current depend upon the total gain of the device and are functions of temperature.

The current gain of either the NPN or the PNP transistor portion may be reduced, thereby increasing $V_{BO}$, by shunting a rectifying junction with a conventional resistor. If the resistor is built into the device, it increases the breakover voltage, but does not prevent temperature sensitivity of the breakover voltage, and the breakover voltage gradually decreases with increasing temperature. In addition the current for switching, $I_{GF}$, is increased, and the power required to switch increased.

The present invention overcomes this problem by using the semiconductor layer 22 as a built-in shunt across at least one of the rectifying junctions, junction 17 being shown shunted. The resistivity of this semiconductor layer is characterized by a negative temperature coefficient so that increases in temperature are accompanied by a decrease in shunt resistance. Thus, the shunt layer 22 reduces current gain at high temperatures where such gain is adequate while exercising only a slight reduction in the device gain at lower temperatures where the device itself has less gain. The overall effect is an improved device characterized by critical breakover voltage and gate firing current parameters relatively insensitive to temperature over a wide range of temperatures.

Figure 3:
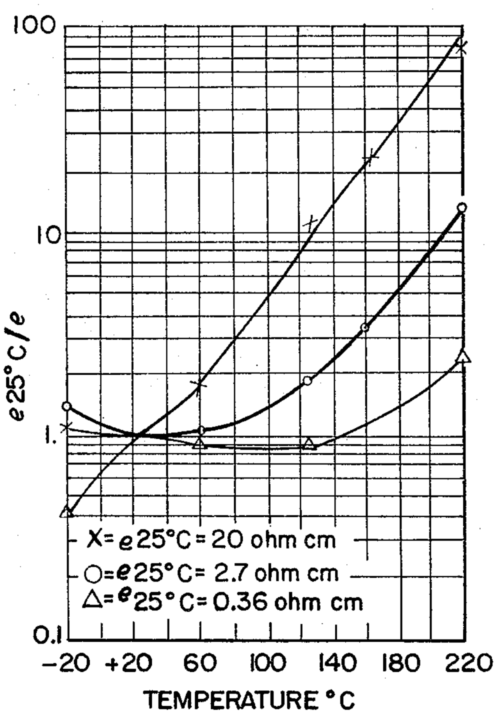
FIG. 3 is a plot of N-type normalized germanium resistivity as a function of temperature for a number of different samples.

In a preferred embodiment of the invention, the four layers 11, 12, 15 and 16 were appropriately doped silicon. The shunting layer 22 is preferably germanium although other semiconductor materials, including organic semiconductor materials, may be used. In an important temperature range of interest extending from 100° C.–200° C. the use of appropriately doped germanium allows control of the temperature at which the shunt resistance is required to start decreasing, thereby facilitating matching particular device characteristics where required. This is accomplished by choosing the proper room temperature resistivity and conductivity type of bulk germanium. Referring to FIG. 3, there is shown a plot of N-type germanium resistivity normalized to its resistivity at 25° C. as a function of temperature for three different bulk resistivities of germanium having the designated resistivities at 25° C. It will be observed that the higher the bulk resistivity, the greater the change in resistivity as a function of temperature.

The germanium resistive element may be applied in order to shunt the appropriate junctions by means of an evaporated or epitaxially grown film; by means of a germanium paste-on suspension, or connected by soldering or alloying a piece of germanium across the silicon regions, or by other suitable means.

Figure 4:
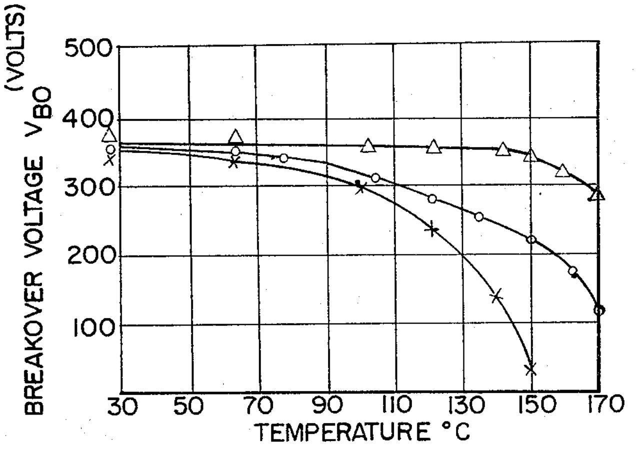
FIG. 4 is a plot of breakover voltage as a function of temperature illustrating the improved performance of a device according to the invention.
Figure 5:
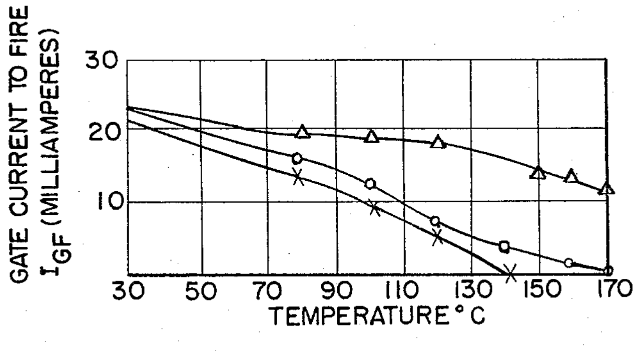
FIG. 5 is a plot of the critical base firing current as a function of temperature illustrative of the benefits obtained with the invention.

Referring to FIGS. 4 and 5, there are shown plots of breakover voltage and gate firing current as a function of temperature for devices according to the invention and devices without the semiconductor shunt to illustrate the marked improvement afforded by the invention. Note that the breakover voltage of a conventional device at 150° C. is less than 1/10 its value at 30° C. while the best device according to the invention using 20 ohms cm. N-type germanium shunt material hardly changes its breakover voltage. Note particularly that the curves of FIG. 5 show that the gate firing current $I_{GF}$ goes to zero at 140° C., rendering the conventional device useless above that temperature, while the device according to the invention still operates satisfactorily at 170° C.

Figure 6:
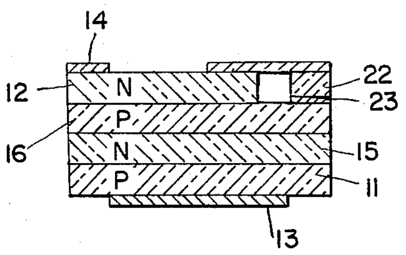
FIG. 6 is a sectional view through a device actually made according to the invention.

FIG. 6 shows a sectional view through a device actually constructed according to the invention. The reference numerals of FIG. 1 identify corresponding portions in FIG. 6. Layers 11, 12, 15 and 16 comprise silicon. N-type layers 12 and 15 are five mils thick while P-type layers 11 and 16 are three mils thick. The resistivity of layers 12, 16, 15 and 11 is respectively 0.002, 0.1, 10 and 0.001 ohm-cm. and that of germanium die 22 is 20 ohm-cm. Die 22 is 20 x 20 x 20 mils. The depth of the layers 11, 12, 15 and 16 may be of the order of 1/4 inch.

There has been described a bistable multiple layer semiconductor device characterized by high switching gain and exceptional temperature stability. It is evident that those skilled in the art may now make numerous modifications of and departures from the specific embodiments and techniques described herein without departing from the inventive concepts. For example, more than one junction may be shunted with semiconductor material. The novel semiconductor shunts may be included in a device having no base lead for inserting and withdrawing a gating current. Consequently, the invention is to be construed as limited only by the spirit and scope of the appended claims.

What is claimed is:

1. A semiconductor device comprising,
a plurality of contiguous layers of semiconductor material defining at least two rectifying junctions of opposite polarity,
and semiconductor material having a negative temperative coefficient of resistance comprising means for introducing a shunt resistance across a single of said junctions interconnecting and in good thermal contact with the two of said layers defining the latter junction which resistance decreases with increases in temperature of said one junction.

2. A semiconductor device in accordance with claim 1 wherein said contiguous layers of semiconductor material comprise silicon and said semiconductor material introducing shunt resistance comprises germanium.

3. A semiconductor device in accordance with claim 1 and further comprising,
first means for contacting an end one of said layers,
second means for contacting the other end one of said layers,
said layers including means for introducing a negative resistance characteristic between said first and second means characterized by a breakover voltage,
said shunt-resistance-introducing-semiconductor material coacting with said layers to comprise means for maintaining said breakover voltage substantially independent of temperature over a wide range of temperatures.

4. A semiconductor device in accordance with claim 3 and further comprising,
means for contacting an intermediate one of said contiguous layers which intermediate layer is adjacent to one of said end layers for applying a gate control signal to said intermediate layer,
said shunt-resistance-introducing-semiconductor material contacting said one end layer and said intermediate layer to coact with said layers to comprise means for maintaining a critical value of said gate control signal required to alter the stable state of said device relatively independent of temperature over a relatively wide range of temperatures.

5. A semiconductor device in accordance with claim 4 wherein said critical value changes by a factor of less than two in a temperature range of 100° centigrade.

6. A semiconductor device in accordance with claim 4 wherein said contiguous layers of semiconductor material comprise silicon and said semiconductor material introducing shunt resistance comprises germanium.

References Cited by the Examiner

UNITED STATES PATENTS

| | | | |
|---|---|---|---|
| 2,789,258 | 4/1957 | Smith | 317—235 |
| 2,971,140 | 2/1961 | Chappey et al. | 317—234 |
| 3,036,226 | 5/1962 | Miller | 307—88.5 |
| 3,050,638 | 8/1962 | Evans et al. | 307—88.5 |
| 3,056,100 | 9/1962 | Warner | 307—88.5 |

JOHN W. HUCKERT, *Primary Examiner.*

DAVID J. GALVIN, *Examiner.*

J. A. ATKINS, J. D. KALLAM, *Assistant Examiners.*